United States Patent
Sato

(10) Patent No.: US 9,252,396 B2
(45) Date of Patent: Feb. 2, 2016

(54) ORGANIC ELECTRO-LUMINESCENCE DISPLAY DEVICE

(71) Applicant: Japan Display Inc., Tokyo (JP)

(72) Inventor: Toshihiro Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/559,945

(22) Filed: Dec. 4, 2014

(65) Prior Publication Data

US 2015/0155525 A1 Jun. 4, 2015

(30) Foreign Application Priority Data

Dec. 4, 2013 (JP) ................................. 2013-251199

(51) Int. Cl.
*H01L 51/50* (2006.01)
*H01L 51/52* (2006.01)
*H01L 27/32* (2006.01)
*H05B 33/12* (2006.01)

(52) U.S. Cl.
CPC .......... *H01L 51/5271* (2013.01); *H01L 27/322* (2013.01); *H01L 51/5225* (2013.01); *H01L 51/5265* (2013.01)

(58) Field of Classification Search
CPC ............ H01L 51/5271; H01L 51/5218; H01L 51/5234; H01L 27/322
USPC .............................. 257/40, 59, 72, 98; 438/29
See application file for complete search history.

(56) References Cited

U.S. PATENT DOCUMENTS

| | | | | |
|---|---|---|---|---|
| 2004/0253413 A1* | 12/2004 | Baba | ...................... | G02B 5/201 428/141 |
| 2008/0284331 A1* | 11/2008 | Hayashi | .............. | H01L 51/5237 313/512 |
| 2009/0021158 A1* | 1/2009 | Tanaka | ................ | H01L 51/5206 313/504 |
| 2010/0013741 A1* | 1/2010 | Watanabe | .............. | G02B 5/201 345/32 |
| 2010/0328943 A1* | 12/2010 | Takamura | .................. | F21S 2/00 362/235 |
| 2011/0050082 A1* | 3/2011 | Inoue | .................. | H01L 51/5237 313/483 |
| 2011/0057920 A1* | 3/2011 | Matsuura | ............ | H01L 27/3258 345/211 |
| 2011/0062476 A1* | 3/2011 | Tobise | .................. | G02B 3/0031 257/98 |
| 2011/0101386 A1* | 5/2011 | Fukuda | ................ | H01L 51/5275 257/89 |
| 2011/0285326 A1* | 11/2011 | Kajitani | ............... | H01L 27/3253 315/312 |
| 2013/0084664 A1* | 4/2013 | Yoshitoku | ........... | H01L 27/3211 438/34 |
| 2013/0210176 A1* | 8/2013 | Fushimi | .............. | H01L 51/5256 438/26 |

FOREIGN PATENT DOCUMENTS

JP 2012-234748 A 11/2012

* cited by examiner

*Primary Examiner* — Vongsavanh Sengdara
*Assistant Examiner* — Thai T Vuong
(74) *Attorney, Agent, or Firm* — Lowe Hauptman & Ham, LLP

(57) ABSTRACT

An organic electro-luminescence display device includes a first substrate, plural pedestals which are provided in a convex shape on the first substrate and have inclined side surfaces, plural first electrodes respectively provided on the respective side surfaces of the pedestals, an organic electro-luminescence film which is provided above the plural pedestals and includes a light-emitting layer laminated on the plural first electrodes, and a second electrode which is provided above the plural pedestals and is laminated on the organic electro-luminescence film. Light generated in the light-emitting layer is transmitted between a first reflection surface and a second reflection surface. The second electrode includes light transmission parts, through which the light passes, above upper end parts of the pedestals. A surface of the second electrode facing the organic electro-luminescence film is the second reflection surface except for the light transmission parts.

22 Claims, 9 Drawing Sheets

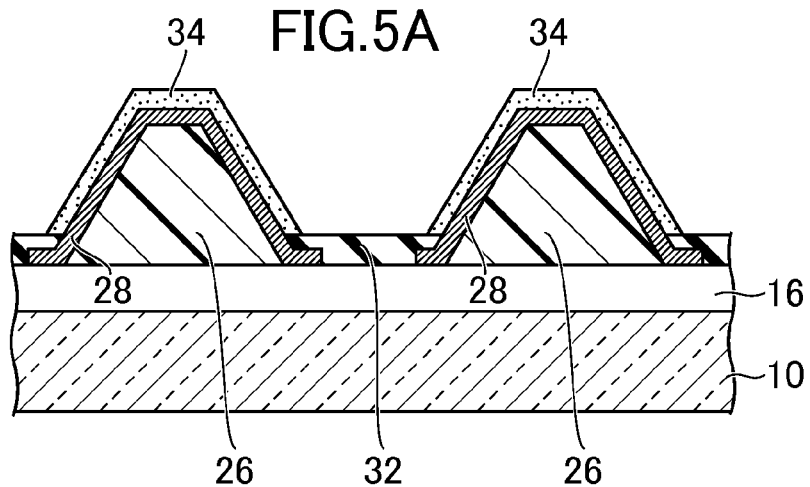
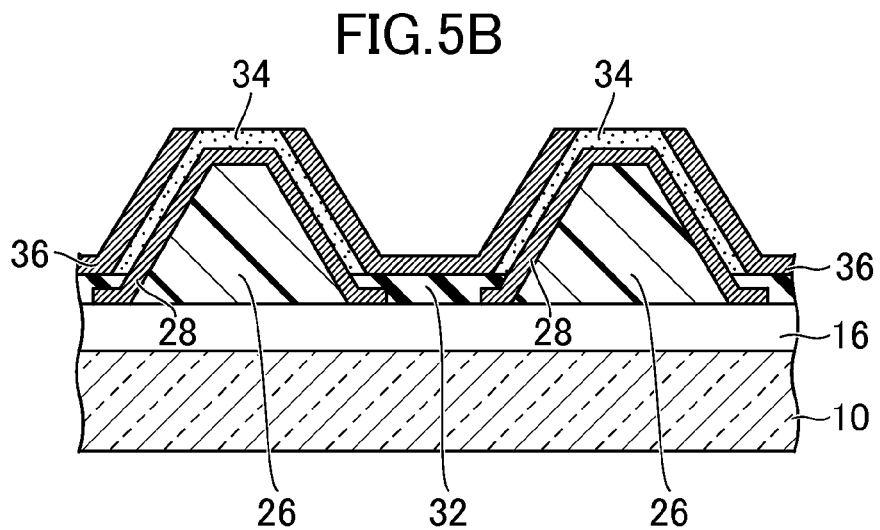
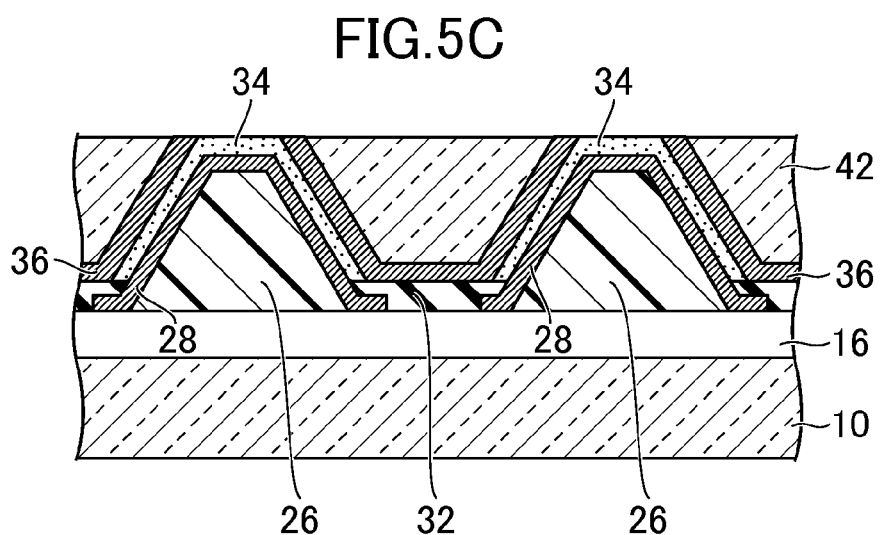

ORGANIC ELECTRO-LUMINESCENCE DISPLAY DEVICE

CROSS-REFERENCE TO RELATED APPLICATION

The present application claims priority from Japanese application JP2013-251199 filed on Dec. 4, 2013, the content of which is hereby incorporated by reference into this application.

BACKGROUND OF THE INVENTION

1. Field of the Invention

The present invention relates to an organic electro-luminescence display device.

2. Description of the Related Art

An organic electro-luminescence display device has a structure in which an organic film is sandwiched between an anode and a cathode (see JP 2012-234748 A). In general, plural organic films are laminated, and one layer thereof is a light-emitting layer. The organic film is covered with a translucent sealing film and is shielded from moisture.

In a high quality display device, a pixel is micronized, so that adjacent pixels are close to each other. Thus, light generated in one of the pixels is transmitted through the sealing film and can enter the adjacent pixel, and a problem of color mixture occurs by this. Hitherto, since about 80% of light is transmitted in a lateral direction or an oblique direction, the efficiency is low.

SUMMARY OF THE INVENTION

The invention has an object to prevent color mixture and to improve efficiency.

(1) An organic electro-luminescence display device of the invention includes a substrate, plural pedestals which are provided in a convex shape on the substrate and have inclined side surfaces, plural first electrodes respectively provided on the respective side surfaces of the pedestals, an organic electro-luminescence film which is provided above the plural pedestals and includes a light-emitting layer laminated on the plural first electrodes, and a second electrode which is provided above the plural pedestals and is laminated on the organic electro-luminescence film, light generated in the light-emitting layer is transmitted between a first reflection surface and a second reflection surface, the second electrode includes light transmission parts, through which the light passes, above upper end parts of the pedestals, and a surface of the second electrode facing the organic electro-luminescence film is the second reflection surface except for the light transmission parts. According to the invention, since the light generated in the light-emitting layer is emitted upward of the upper end part of the pedestal, the light is hard to enter an adjacent pixel. By this, color mixture can be prevented and efficiency can be improved.

(2) In the organic electro-luminescence display device as recited in (1), surfaces of the first electrodes facing the light-emitting layer are the first reflection surface.

(3) In the organic electro-luminescence display device as recited in (2), the light-emitting layer includes plural light-emitting layers each of which emits light of one of plural colors, and each of the plural light-emitting layers is laminated on one of the first electrodes.

(4) The organic electro-luminescence display device as recited in (3) further includes an insulation layer provided between the adjacent pedestals and placed on end parts of the adjacent first electrodes.

(5) In the organic electro-luminescence display device as recited in (4), a refractive index of the insulation layer is higher than that of the plural light-emitting layers, end parts of the adjacent light-emitting layers are disposed to be separated from each other and to contact the insulation layer, and the second electrode contacts the insulation layer between the adjacent light-emitting layers.

(6) In the organic electro-luminescence display device as recited in (1), the light-emitting layer is continuously laminated on the plural first electrodes and emits light of one color.

(7) The organic electro-luminescence display device as recited in (6) further includes a color filter.

(8) The organic electro-luminescence display device as recited in (6) further includes mirror layers arranged below the respective pedestals, the plural pedestals and the first electrode respectively have light transmissivity, the plural pedestals include colored layers of plural colors to constitute a color filter, and surfaces of the mirror layers facing the pedestals are the first reflection surface.

(9) In the organic electro-luminescence display device as recited in (8), each of the mirror layers has conductivity and is electrically connected to one of the first electrodes.

(10) The organic electro-luminescence display device as recited in any one of (6) to (9) further includes an insulation layer which is provided between the adjacent pedestals and is placed on end parts of the adjacent first electrodes.

(11) In the organic electro-luminescence display device as recited in (10), a refractive index of the insulation layer is higher than that of the light-emitting layer, and the light-emitting layer is provided to cover the insulation layer.

(12) In the organic electro-luminescence display device as recited in any one of (1) to (11), the plural first electrodes are provided while avoiding the upper end parts of the plural pedestals.

(13) In the organic electro-luminescence display device as recited in (12), the light-emitting layer is provided while avoiding regions above the upper end parts of the plural pedestals.

(14) In the organic electro-luminescence display device as recited in (13), the second electrode is provided while avoiding the regions above the upper end parts of the plural pedestals, and the light transmission parts are openings provided in the second electrode.

(15) In the organic electro-luminescence display device as recited in any one of (1) to (11), the plural first electrodes are provided to be placed on the upper end parts of the plural pedestals.

(16) In the organic electro-luminescence display device as recited in (15), the light-emitting layer is provided above the upper end parts of the plural pedestals to be placed on the plural first electrodes.

(17) In the organic electro-luminescence display device as recited in (16), the second electrode is provided above the upper end parts of the plural pedestals to be placed on the light-emitting layer, and the light transmission parts are made of transparent conductive material.

(18) In the organic electro-luminescence display device as recited in (17), the second electrode includes a transparent layer made of the transparent conductive material and a reflection layer made of material to reflect light, and the reflection layer is laminated on the organic electro-luminescence film above the side surfaces of the plural pedestals while avoiding regions above the upper end parts of the plural pedestals.

(19) In the organic electro-luminescence display device as recited in (18), the reflection layer contacts the organic electro-luminescence film, and the transparent layer is provided to cover the reflection layer.

(20) In the organic electro-luminescence display device as recited in any one of (1) to (19), the second electrode has unevenness corresponding to shapes of the plural pedestals, and a flattening film is provided in a concave part to have a thickness equal to a height of a convex part of the unevenness.

(21) The organic electro-luminescence display device as recited in (20) further includes a sealing film which is provided above the second electrode and the flattening film and seals the organic electro-luminescence film.

(22) In the organic electro-luminescence display device as recited in any one of (1) to (21), each of the plural pedestals has a truncated shape.

BRIEF DESCRIPTION OF THE DRAWINGS

FIGS. 5A to 5C are views for explaining a manufacturing method of the organic electro-luminescence display device of the first embodiment.

DETAILED DESCRIPTION OF THE INVENTION

Hereinafter, embodiments of the invention will be described with reference to the drawings.

First Embodiment

Figure 1:
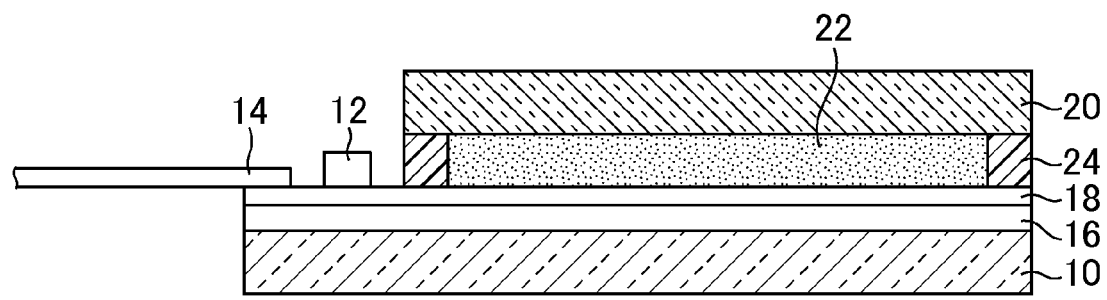
FIG. 1 is a sectional view of an organic electro-luminescence display device of a first embodiment of the invention.

FIG. 1 is a sectional view of an organic electro-luminescence display device of a first embodiment of the invention. The organic electro-luminescence display device includes a first substrate 10. The first substrate 10 is mounted with an integrated circuit chip 12 for driving an element for displaying an image. The first substrate 10 is connected with a flexible wiring board 14 for electrical connection with the outside. A circuit layer 16 including a not-shown thin film transistor, a wiring and an insulation layer is formed on the first substrate 10. An element layer 18 is laminated on the circuit layer 16. The details of the element layer 18 will be described later.

The display device includes a second substrate 20. The second substrate 20 is arranged to be separated from and to face the first substrate 10. A filler 22 is provided between the first substrate 10 and the second substrate 20, and the filler 22 is surrounded and sealed by a seal member 24.

Figure 2:
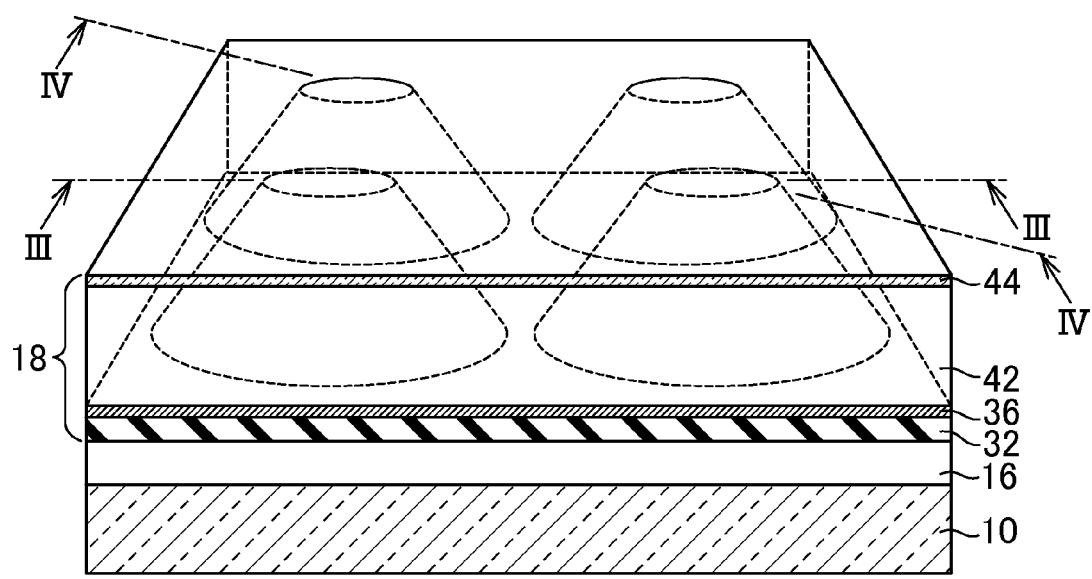
FIG. 2 is a sectional perspective view showing a part of a first substrate and a lamination structure thereon.
Figure 3:
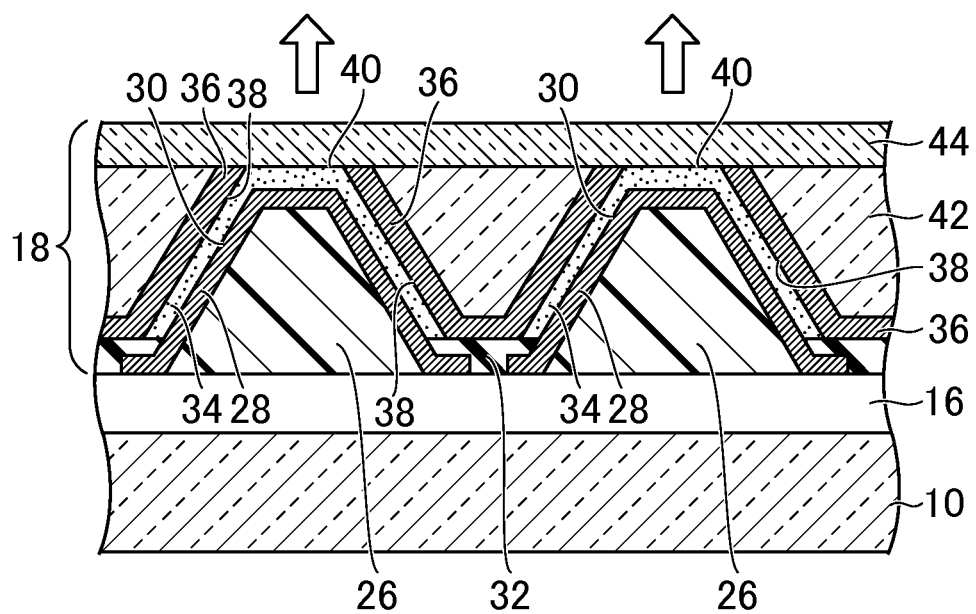
FIG. 3 is a line sectional view of a structure shown in FIG. 2.
Figure 4:
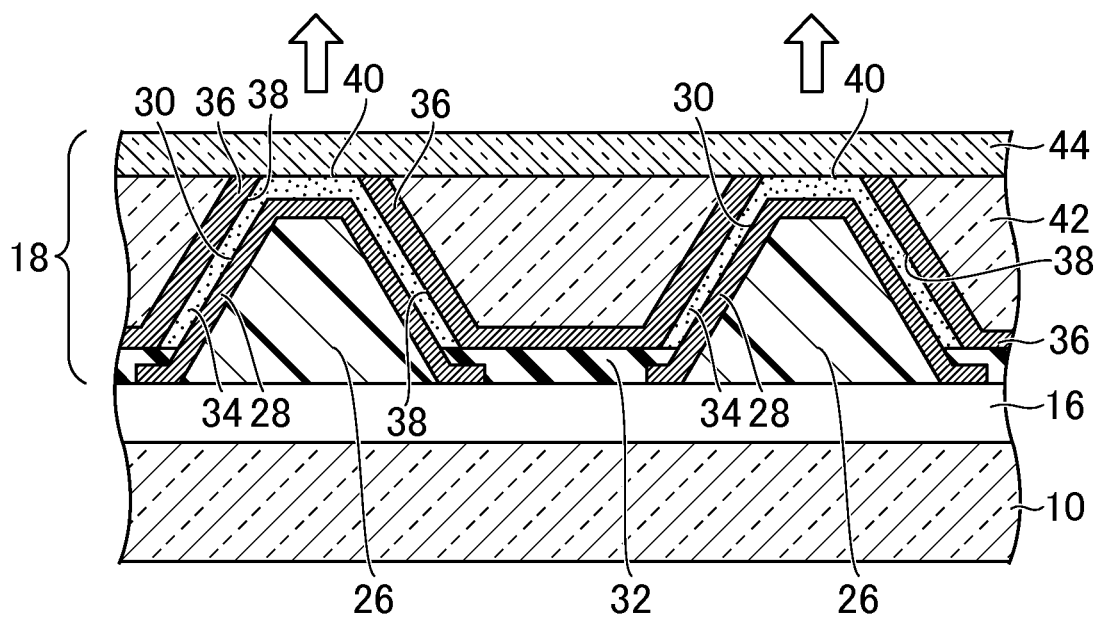
FIG. 4 is a IV-IV line sectional view of the structure shown in FIG. 2.

FIG. 2 is a sectional perspective view showing a part of the first substrate and the lamination structure thereon. FIG. 3 is a III-III line sectional view of the structure shown in FIG. 2. FIG. 4 is a IV-IV line sectional view of the structure shown in FIG. 2.

The element layer 18 includes plural pedestals 26. The plural pedestals 26 are formed in a convex shape on the first substrate 10. Each of the pedestals 26 is made of a resin such as acrylic resin. The pedestal 26 may have light transmissivity or may have light shielding property. The pedestal 26 is formed in a truncated shape such as a truncated cone or a truncated pyramid. The pedestal 26 includes an inclined side surface. The side surface of the truncated conical pedestal 26 has a taper shape. An upper end part of the pedestal 26 has a flat upper surface. The plural pedestals 26 are arranged in matrix to form plural rows and plural columns.

A first electrode 28 (anode) is provided on the side surface of the pedestal 26. The first electrode 28 is placed also on the upper end part of the pedestal 26. The first electrode 28 reflects light. Particularly, the first electrode 28 is made of a single layer of metal such as silver or aluminum, and the surface (surface on the side opposite to the pedestal 26) may reflect light. Alternatively, if the first electrode 28 is formed of plural layers, the outermost layer is formed of transparent conductive material such as indium tin oxide or indium zinc oxide, and a surface of a lower layer made of metal such as silver or aluminum may reflect light. In any case, the first electrode 28 includes a first reflection surface 30 to reflect light on the side opposite to the pedestal 26.

The first electrode 28 is connected to a not-shown thin film transistor through a not-shown wiring of the circuit layer 16. The first electrode 28 is provided to protrude from the pedestal 26. The uppermost layer of the circuit layer 16 is a passivation film made of, for example, $SiO_2$, and the end part of the first electrode 28 is placed thereon.

An insulation layer 32 is provided between the adjacent pedestals 26 and is placed on the end parts of the adjacent first electrodes 28. For example, the insulation layer 32 is placed on the portion of the first electrode 28 protruding from the pedestal 26. In this example, the insulation layer 32 is located at a position not overlapping the pedestal 26. In other words, as shown in FIG. 2, the insulation layer 32 is provided on the circuit layer 16 so as to avoid the pedestals 26. If the insulation layer 32 has light transmissivity, the insulation layer is made of material having high refractive index, such as silicon nitride.

Organic electro-luminescence films 34 are provided above the pedestals 26. Although not shown, the organic electro-luminescence film 34 includes plural layers which include at least a light-emitting layer and further include at least one of an electron transport layer, a hole transport layer, an electron injection layer and a hole injection layer. The plural organic electro-luminescence films 34 are provided so that each of the light-emitting layers emits light of one of plural colors. Accordingly, the plural light-emitting layers generate lights of plural colors.

The light-emitting layer is provided to be placed also on an upper end part of the pedestal 26. Since the pedestal 26 is provided in a convex shape, the surface is wider than the bottom surface. Thus, the organic electro-luminescence film 34 (light-emitting layer) can be provided widely, and accordingly, the light emission efficiency is improved. By this, high brightness can be obtained, or the life can be prolonged by reducing current density.

The organic electro-luminescence film 34 (light-emitting layer) is laminated on the first electrode 28. Respective end parts of the adjacent organic electro-luminescence films 34 (light-emitting layers) are separated from each other and are arranged so as to contact the insulation layer 32. The refractive index of the light-emitting layer is lower than the refractive index of the insulation layer 32. The refractive index of the insulation layer 32 is higher than the refractive index of the light-emitting layer. Since the refractive indexes of the light-emitting layer and the insulation layer 32 are different from each other, the light generated in the light-emitting layer is liable to be reflected at the interface between the light-emitting layer and the insulation layer 32. Accordingly, even if the insulation layer 32 has light transmissivity, the light generated in the light-emitting layer is hard to pass through the insulation layer 32.

A second electrode 36 (cathode) is laminated above the plural pedestals 26 and on the organic electro-luminescence film 34 (light-emitting layer). The second electrode 36 is made of metal such as silver or aluminum, and reflects light. Particularly, the second electrode 36 includes a second reflection surface 38 to reflect light on the side facing the organic electro-luminescence film 34 (light-emitting layer).

A voltage is applied to the first electrode 28 and the second electrode 36, so that holes and electrons are injected into the organic electro-luminescence film 34. The injected holes and electrons are combined in the light-emitting layer and light is emitted. Since the insulation layer 32 intervenes between the end part of the first electrode 28 and the second electrode 36, short circuiting between the two is prevented.

The organic electro-luminescence film 34 (light-emitting layer) is sandwiched between the first reflection surface 30 and the second reflection surface 38. The surface of the first electrode 28 on the side facing the light-emitting layer is the first reflection surface 30. The surface of the second electrode 36 on the side facing the organic electro-luminescence film 34 (light-emitting layer) is the second reflection surface 38. The first reflection surface 30 and the second reflection surface 38 constitute a light cavity. The light generated in the light-emitting layer is transmitted between the first reflection surface 30 and the second reflection surface 38, and light of a specific wavelength is amplified.

The second electrode 36 is provided so as to avoid a region above the upper end part of the pedestal 26. The second electrode 36 includes a light transmission part 40, through which light passes, above the upper end part of the pedestal 26. The light transmission part 40 is an opening formed in the second electrode 36. The light generated in the organic electro-luminescence film 34 (light-emitting layer) is emitted from the light transmission part 40 of the second electrode 36. Since the light is transmitted between the first reflection surface 30 and the second reflection surface 38, the light is emitted uniformly in all directions. Thus, wide viewing angle characteristics can be obtained. Besides, since a light emission region is limited to the light transmission part 40, light leakage can be prevented.

According to this embodiment, since the light generated in the light-emitting layer is emitted upward of the upper end part of the pedestal 26, the light is hard to enter the adjacent pixel. By this, color mixture can be prevented and efficiency can be improved.

The second electrode 36 contacts the insulation layer 32 between the adjacent light-emitting layers. The second electrode 36 is formed to have unevenness corresponding to the shape of the plural pedestals 26. A flattening film 42 is provided in a concave part so as to have a height equal to the height of a convex part of the unevenness of the second electrode 36. The upper surface of the flattening film 42 is flush with the highest upper end surface (peripheral edge surface of the opening) of the convex part of the second electrode 36 and the highest upper surface (surface above the upper end part of the pedestal 26) of the organic electro-luminescence film 34 (light-emitting layer). Since the flattening film 42 has light transmissivity, external light enters. The light entering the flattening film 42 is scattered by the unevenness of the second electrode 36, reduction of visibility by reflected light can be suppressed.

A sealing film 44 is provided above the second electrode 36 and the flattening film 42. The sealing film 44 seals and shields the organic electro-luminescence film 34 from moisture. The sealing film 44 may be formed of one layer or may be formed of plural layers. A lower surface of the sealing film 44 contacts the organic electro-luminescence film 34 (light-emitting layer) in the opening of the second electrode 36.

FIGS. 5A to 5C are views for explaining a manufacturing method of the organic electro-luminescence display device of the first embodiment.

As shown in FIG. 5A, the circuit layer 16 is formed on the first substrate 10, and the plural pedestals 26 are formed on the circuit layer 16. The pedestals 26 are made of resin, and nanoimprint may be used as a forming method thereof. Next, the first electrodes 28 are formed on the pedestals 26. The first electrodes 28 are formed by patterning, for example, by etching a conductive film formed so as to cover the pedestals 26. The lower end parts of the first electrodes 28 are formed to protrude from the pedestals 26, and the insulation layer 32 is formed to be placed thereon. Then, the organic electro-luminescence films 34 are formed by evaporation or sputtering. The organic electro-luminescence films 34 are formed to include light-emitting layers and to cover the first electrodes 28. As shown in FIG. 5B, the second electrode 36 is formed so as to have the opening above the upper end part of the pedestal 26. Then, as shown in FIG. 5C, the flattening film 42 is formed. Thereafter, as shown in FIG. 4, the sealing film 44 is formed. The details of the manufacturing method include contents obvious from the description of the apparatus.

Second Embodiment

Figure 6:
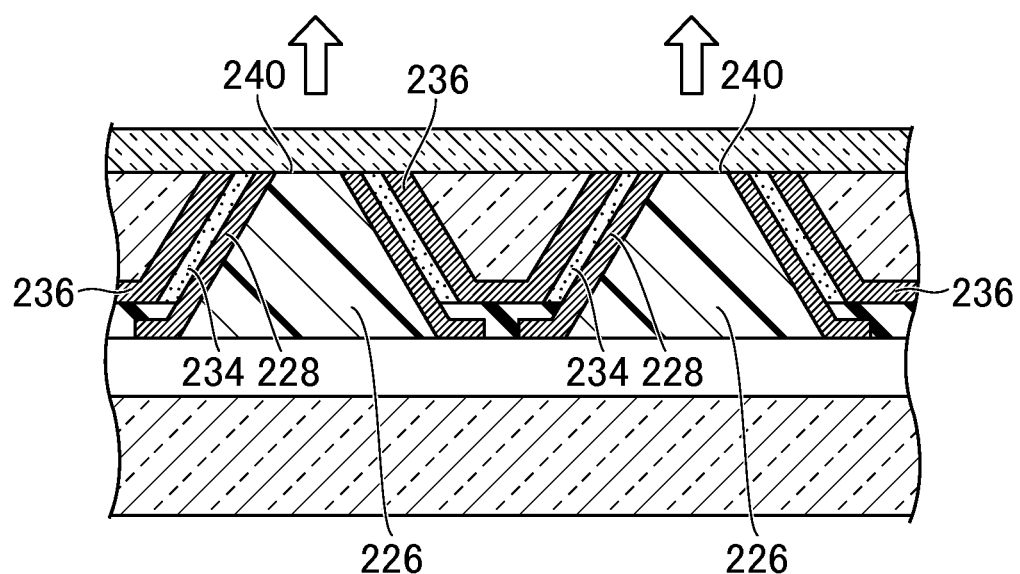
FIG. 6 is an enlarged sectional view of a part of an organic electro-luminescence display device of a second embodiment of the invention.

FIG. 6 is an enlarged sectional view of a part of an organic electro-luminescence display device of a second embodiment of the invention. In this embodiment, plural first electrodes 228 are provided so as to avoid upper end parts of plural pedestals 226. Organic electro-luminescence films 234 (light-emitting layers) are provided so as to avoid regions above upper end parts of the pedestals 226. These are different from the first embodiment.

The other details are the same as the contents described in the first embodiment. For example, a second electrode 236 is provided so as to avoid the region above the upper end part of the pedestal 226. A light transmission parts 240 is an openings formed in the second electrode 236.

Third Embodiment

Figure 7:
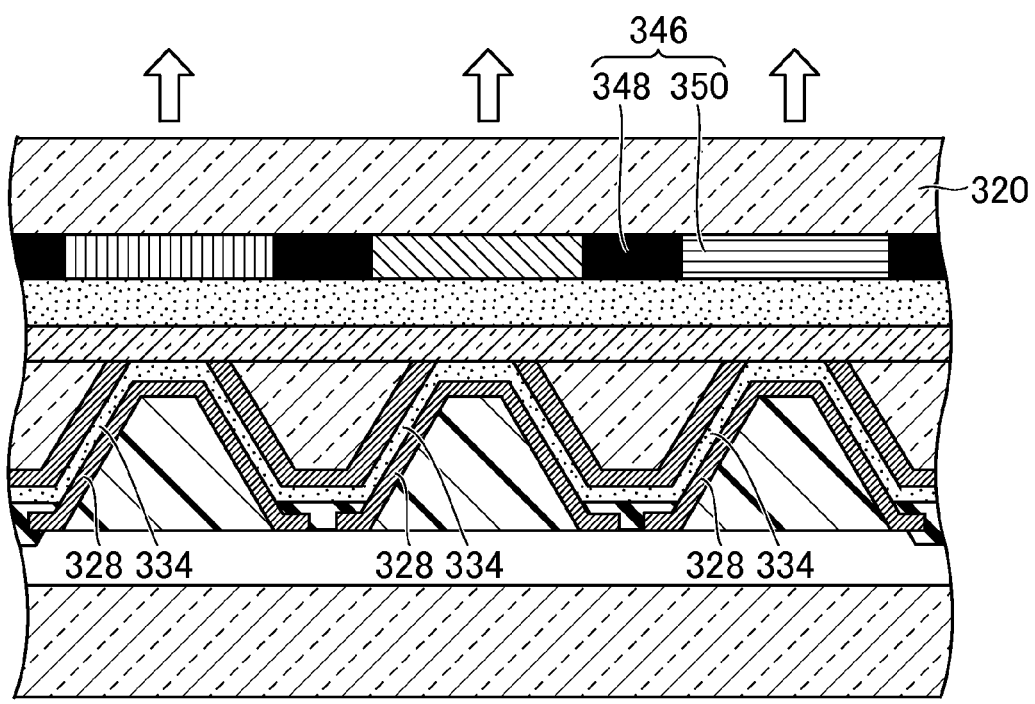
FIG. 7 is an enlarged sectional view of a part of an organic electro-luminescence display device of a third embodiment of the invention.

FIG. 7 is an enlarged sectional view of a part of an organic electro-luminescence display device of a third embodiment of the invention. In this embodiment, an organic electro-luminescence film 334 is continuously laminated on plural first electrodes 328, and a light-emitting layer emits light of one color (for example, white). A color filter 346 is provided on a second substrate 320 in order to perform full-color image display. The color filter 346 includes a black matrix 348 and a colored layer 350 of plural colors. These are different from the first embodiment. The other details are the same as the contents described in the first embodiment.

Fourth Embodiment

Figure 8:
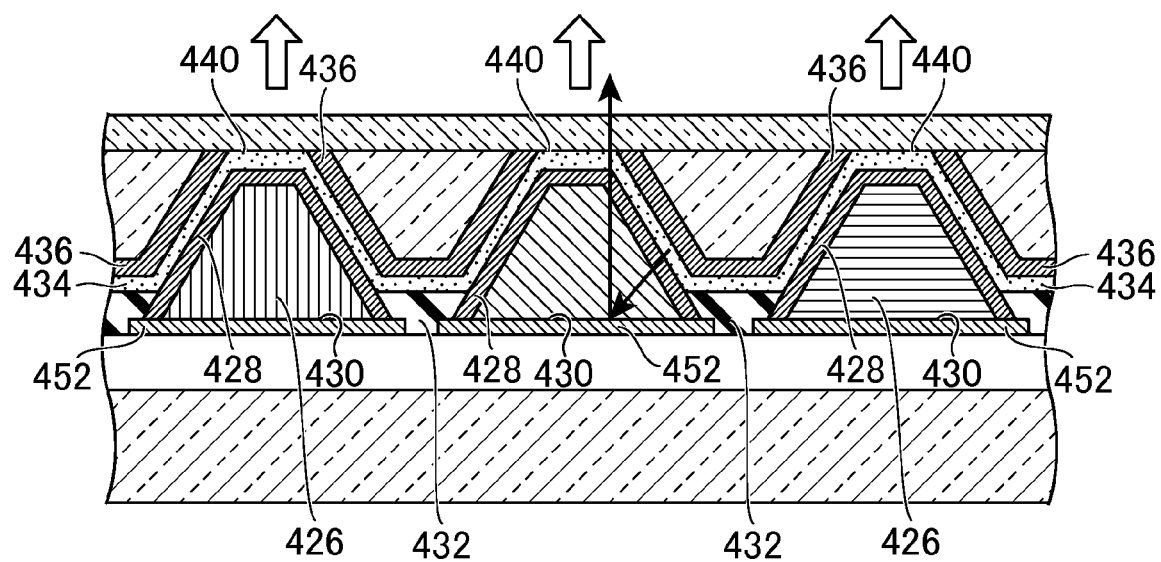
FIG. 8 is an enlarged sectional view of a part of an organic electro-luminescence display device of a fourth embodiment of the invention.

FIG. 8 is an enlarged sectional view of an organic electro-luminescence display device of a fourth embodiment of the invention.

In this embodiment, an organic electro-luminescence film 434 (light-emitting layer) is placed on first electrodes 428 above upper end parts of pedestals 426 and is continuously laminated on the plural first electrodes 428. A light-emitting layer emits light of one color (for example, white).

The first electrodes 428 are provided so as to be placed also on the upper end parts of the pedestals 426. The first electrodes 428 are made of transparent conductive material such as indium tin oxide or indium zinc oxide, and have light transmissivity. Accordingly, light generated in the light-emitting layer passes through the first electrodes 428.

Each of the plural pedestals 426 has light transmissivity, and allows light of a specific wavelength to pass through. A light of a specific color among lights passing through the first electrode 428 passes through the pedestal 426. Plural kinds of the pedestals 426 to allow lights of different colors (for example, red, blue and green) to pass through are provided. That is, the plural pedestals 426 include colored layers of plural colors so as to constitute a color filter.

Mirror layers 452 are respectively arranged under the respective pedestals 426. Surfaces of the mirror layers 452 facing the pedestals 426 are first reflection surfaces 430. Light generated in the light-emitting layer is reflected by the first reflection surface 430 of the mirror layer 452, travels through the pedestal 426 and is emitted from a light transmission part 440 (opening) of a second electrode 436. The mirror layer 452 has conductivity and is electrically connected to one of the first electrodes 428.

An insulation layer 432 is provided between the adjacent pedestals 426 and is placed on end parts of the adjacent first electrodes 428. The refractive index of the insulation layer 432 is higher than that of the light-emitting layer. The light-emitting layer is provided so as to cover the insulation layer 432. The other details are the same as the contents described in the first embodiment.

Fifth Embodiment

Figure 9:
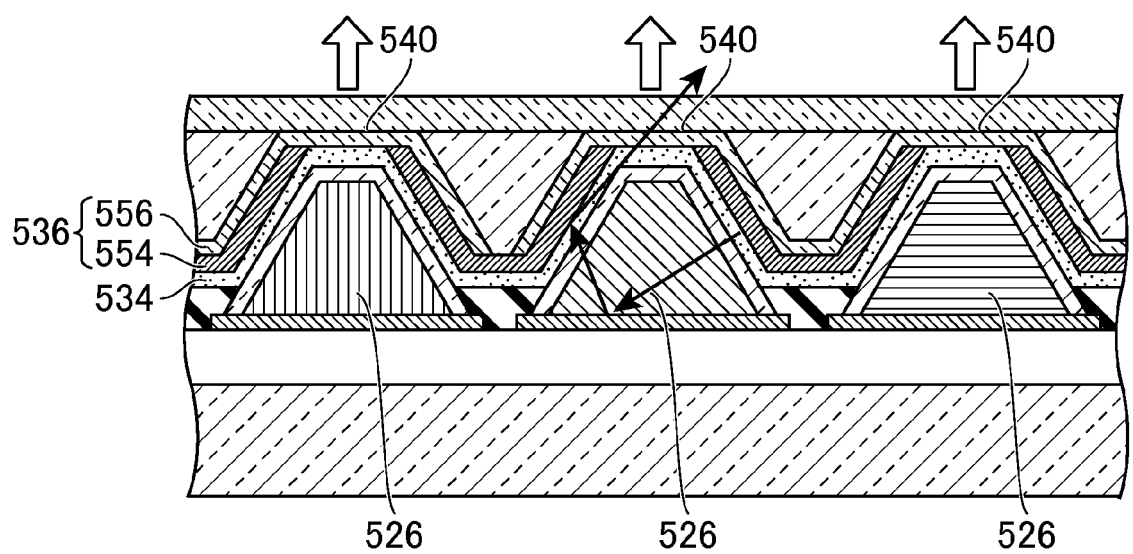
FIG. 9 is an enlarged sectional view of a part of an organic electro-luminescence display device of a fifth embodiment of the invention.

FIG. 9 is an enlarged sectional view of a part of an organic electro-luminescence display device of a fifth embodiment of the invention.

In this embodiment, a second electrode 536 includes a reflection layer 554 made of material (metal such as, for example, silver or aluminum) to reflect light. The reflection layer 554 is provided so as to avoid regions above upper end parts of plural pedestals 526. The regions which the reflection layer 554 avoids are light transmission parts 540 of the second electrode 536. The reflection layer 554 is laminated on an organic electro-luminescence film 534 above side surfaces of plural pedestals 526. The reflection layer 554 contacts the organic electro-luminescence film 534.

The second electrode 536 includes a transparent layer 556 made of transparent conductive material such as indium tin oxide or indium zinc oxide. The transparent layer 556 is provided so as to cover the reflection layer 554. The transparent layer 556 is provided so as to be placed on the organic electro-luminescence film 534 (light-emitting layer) above the upper end parts of the plural pedestals 526. The light transmission part 540 is made of the transparent layer 556 (transparent conductive material).

Although this embodiment is an example in which the second electrode 536 including the reflection layer 554 and the transparent layer 556 is applied to the fourth embodiment, this feature can be applied to any other embodiments.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electro-luminescence display device comprising:
   a substrate;
   a plurality of pedestals which are provided in a convex shape on the substrate and have inclined side surfaces;
   a plurality of first electrodes respectively provided on the respective side surfaces of the pedestals;
   an organic electro-luminescence film which is provided above the plurality of pedestals and includes a light-emitting layer laminated on the plurality of first electrodes; and
   a second electrode which is provided above the plurality of pedestals and is laminated on the organic electro-luminescence film, wherein
   light generated in the light-emitting layer is transmitted between a first reflection surface and a second reflection surface,
   the second electrode includes light transmission parts, through which the light passes, above upper end parts of the pedestals, and
   a surface of the second electrode facing the organic electro-luminescence film is the second reflection surface except for the light transmission parts.

2. The organic electro-luminescence display device according to claim 1, wherein surfaces of the first electrodes facing the light-emitting layer are the first reflection surface.

3. The organic electro-luminescence display device according to claim 2, wherein the light-emitting layer includes a plurality of light-emitting layers each of which emits light of one of a plurality of colors, and
   each of the plurality of light-emitting layers is laminated on one of the first electrodes.

4. The organic electro-luminescence display device according to claim 3, further comprising an insulation layer provided between the adjacent pedestals and placed on end parts of the adjacent first electrodes.

5. The organic electro-luminescence display device according to claim 4, wherein
   a refractive index of the insulation layer is higher than that of the plurality of light-emitting layers,
   end parts of the adjacent light-emitting layers are disposed to be separated from each other and to contact the insulation layer, and
   the second electrode contacts the insulation layer between the adjacent light-emitting layers.

6. The organic electro-luminescence display device according to claim 1, wherein the light-emitting layer is continuously laminated on the plurality of first electrodes and emits light of one color.

7. The organic electro-luminescence display device according to claim 6, further comprising a color filter.

8. The organic electro-luminescence display device according to claim 6, further comprising mirror layers arranged below the respective pedestals, wherein
   the plurality of pedestals and the first electrode respectively have light transmissivity,
   the plurality of pedestals include colored layers of a plurality of colors to constitute a color filter, and
   surfaces of the mirror layers facing the pedestals are the first reflection surface.

9. The organic electro-luminescence display device according to claim 8, wherein each of the mirror layers has conductivity and is electrically connected to one of the first electrodes.

10. The organic electro-luminescence display device according to claim 6, further comprising an insulation layer which is provided between the adjacent pedestals and is placed on end parts of the adjacent first electrodes.

11. The organic electro-luminescence display device according to claim 10, wherein
 a refractive index of the insulation layer is higher than that of the light-emitting layer, and
 the light-emitting layer is provided to cover the insulation layer.

12. The organic electro-luminescence display device according to claim 1, wherein the plurality of first electrodes are provided while avoiding the upper end parts of the plurality of pedestals.

13. The organic electro-luminescence display device according to claim 12, wherein the light-emitting layer is provided while avoiding regions above the upper end parts of the plurality of pedestals.

14. The organic electro-luminescence display device according to claim 13, wherein
 the second electrode is provided while avoiding the regions above the upper end parts of the plurality of pedestals, and
 the light transmission parts are openings provided in the second electrode.

15. The organic electro-luminescence display device according to claim 1, wherein the plurality of first electrodes are provided to be placed on the upper end parts of the plurality of pedestals.

16. The organic electro-luminescence display device according to claim 15, wherein the light-emitting layer is provided above the upper end parts of the plurality of pedestals and is placed on the plurality of first electrodes.

17. The organic electro-luminescence display device according to claim 16, wherein
 the second electrode is provided above the upper end parts of the plurality of pedestals and is placed on the light-emitting layer, and
 the light transmission parts are made of transparent conductive material.

18. The organic electro-luminescence display device according to claim 17, wherein
 the second electrode includes a transparent layer made of the transparent conductive material and a reflection layer made of material to reflect light, and
 the reflection layer is laminated on the organic electro-luminescence film above the side surfaces of the plurality of pedestals while avoiding regions above the upper end parts of the plurality of pedestals.

19. The organic electro-luminescence display device according to claim 18, wherein
 the reflection layer contacts the organic electro-luminescence film, and
 the transparent layer is provided to cover the reflection layer.

20. The organic electro-luminescence display device according to claim 1, wherein
 the second electrode has unevenness corresponding to shapes of the plurality of pedestals, and
 a flattening film is provided in a concave part of the unevenness to have a thickness equal to a height of a convex part of the unevenness.

21. The organic electro-luminescence display device according to claim 20, further comprising a sealing film which is provided above the second electrode and the flattening film and seals the organic electro-luminescence film.

22. The organic electro-luminescence display device according to claim 1, wherein each of the plurality of pedestals has a truncated shape.

* * * * *